United States Patent
Leung et al.

(10) Patent No.: US 9,379,749 B2
(45) Date of Patent: Jun. 28, 2016

(54) VCO-COUPLING MITIGATION IN A MULTIPLE-CARRIER, CARRIER AGGREGATION RECEIVER

(71) Applicant: QUALCOMM Incorporated, San Diego, CA (US)

(72) Inventors: Lai Kan Leung, San Marcos, CA (US); Chiewcharn Narathong, Laguna Niguel, CA (US); Rajagopalan Rangarajan, San Diego, CA (US); Dongling Pan, San Diego, CA (US); Yiwu Tang, San Diego, CA (US); Aleksandar Miodrag Tasic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/704,573

(22) Filed: May 5, 2015

(65) Prior Publication Data
US 2015/0333761 A1 Nov. 19, 2015

Related U.S. Application Data

(60) Provisional application No. 61/994,032, filed on May 15, 2014.

(51) Int. Cl.
*H04B 1/04* (2006.01)
*H04B 15/06* (2006.01)
(Continued)

(52) U.S. Cl.
CPC ............. *H04B 1/1081* (2013.01); *H04B 1/005* (2013.01); *H04B 1/0475* (2013.01);
(Continued)

(58) Field of Classification Search
CPC ................... H04B 1/0483; H04B 2001/0491; H04B 1/1081; H04B 1/405; H04B 1/525; H03B 2202/04; H03B 2202/044; H03B 2202/046; H03B 2202/082; H03L 7/099
USPC .......................................................... 331/46
See application file for complete search history.

(56) References Cited

U.S. PATENT DOCUMENTS 8,503,507 B2    8/2013  Kianush et al.
8,805,309 B2 *  8/2014  Leenaerts ............. H03D 7/163
                                                          455/132
(Continued)

OTHER PUBLICATIONS

Ahmad M., et al., "21.8 a pulling mitigation technique for direct-conversion transmitters", IEEE International Solid State Circuits Conference, IEEE Service Center, New York, NY, US, Feb. 9, 2014, pp. 374-375, XP032575099, ISSN: 0193-6530, DOI: 10.1109/ISSCC.2014.6757476 ISBN: 978-1-4799-0918-6 [retrieved on Mar. 5, 2014] the whole document.

(Continued)

*Primary Examiner* — Ryan Johnson
(74) *Attorney, Agent, or Firm* — Arent Fox LLP

(57) ABSTRACT

Aspects of a wireless apparatus for configuring a plurality of VCOs are provided. The apparatus may be a UE. The UE receives a configuration for a plurality of carriers. Each carrier corresponds to a different LO frequency. In addition, the UE determines a VCO frequency for generating each LO frequency. Further, the UE assigns each determined VCO frequency to each of a plurality of VCO modules based on a distance between the VCO modules and each of the determined VCO frequencies. The plurality of VCO modules are of a set of VCO modules including at least three VCO modules.

20 Claims, 8 Drawing Sheets

(51) Int. Cl.
  *H04B 1/10* (2006.01)
  *H04B 1/00* (2006.01)
  *H04B 1/525* (2015.01)
(52) U.S. Cl.
  CPC ............ *H04B 1/0483* (2013.01); *H04B 1/525* (2013.01); *H04B 15/06* (2013.01); *H03B 2202/044* (2013.01); *H03B 2202/046* (2013.01); *H04B 2001/0491* (2013.01)

(56) References Cited

U.S. PATENT DOCUMENTS 9,007,131 B2* 4/2015 Mirzaei ................... H03L 7/085
                                                      327/156
2007/0109065 A1  5/2007 Pipilos
2011/0002424 A1  1/2011 Le Guillou
2013/0229954 A1  9/2013 Narathong et al.
2014/0191811 A1  7/2014 Mirzaei et al.
2014/0370882 A1* 12/2014 Liu ........................ H04W 88/06
                                                      455/422.1
2015/0078497 A1*  3/2015 Zhang ................. H04L 27/2647
                                                      375/347
2015/0311906 A1* 10/2015 Nilsson ................ H03B 5/1234
                                                      331/17

OTHER PUBLICATIONS

International Search Report and Written Opinion—PCT/US2015/029764—ISA/EPO—Jul. 24, 2015.

* cited by examiner

VCO-COUPLING MITIGATION IN A MULTIPLE-CARRIER, CARRIER AGGREGATION RECEIVER

CROSS-REFERENCE TO RELATED APPLICATION

This application claims the benefit of U.S. Provisional Application Ser. No. 61/994,032, entitled, "VCO-Coupling Mitigation in a Multiple-Carrier, Carrier Aggregation Receiver," and filed on May 15, 2014, which is expressly incorporated by reference herein in its entirety.

TECHNICAL FIELD

Various exemplary embodiments disclosed herein relate generally to electronic circuits. In particular, various embodiments relate to wireless devices that include multiple carrier-aggregation receivers.

BACKGROUND

In wireless communications, wireless devices are now capable of sending or receiving communications with multiple carriers simultaneously. Devices use frequency synthesizers based on oscillators, such as voltage-controlled oscillators (VCOs) to generate each of the desired frequencies. Depending on the target frequency bands, a device may be required to generate multiple, similar frequencies simultaneously.

When two VCOs run at similar frequencies however, VCO pulling occurs, which causes phase noise degradation and in-band spurs. VCO pulling can cause the output frequencies of the VCOs to vary from the target frequency.

VCO pulling is currently avoided by operating multiple VCOs at non-similar frequencies even if target frequencies for local oscillators (LOs) are similar. For example, if the wireless device requires two LO frequencies of 2.4 and 2.5 GHz, respectively, implementation of the frequency plan would have one VCO producing an operating frequency of 2.4 GHz, while the second VCO produces a frequency of 10 GHz that is sent through a divide-by-4 circuit to produce the LO frequency of 2.5 GHz. Such implementation leads to high current consumption. Use of such high frequencies also exasperates issues relating to the use of VCOs, such as phase noise degradation and in-band spurs.

In view of the foregoing, it would be desirable to run multiple VCOs to generate similar frequencies. In particular, it would be desirable to enable VCOs to effectively operate in a narrow range of operating frequencies for a receiver on the wireless device.

SUMMARY

In light of the present need for improved parallel VCO frequency production in a wireless device, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Aspects of a wireless apparatus and methods for configuring a plurality of VCOs are provided. For example, the apparatus receives a configuration for a plurality of carriers. Each carrier corresponds to a different LO frequency. The apparatus determines a VCO frequency for generating each LO frequency. The apparatus assigns each determined VCO frequency to each of a plurality of VCO modules based on a distance between the VCO modules and each of the determined VCO frequencies. The plurality of VCO modules are of a set of VCO modules including at least three VCO modules.

In an aspect, a wireless apparatus for configuring a plurality of VCOs are provided. For example, the apparatus includes a set of VCO modules, including at least three VCO modules. The apparatus also includes means for receiving a configuration for a plurality of carriers. Each carrier corresponds to a different LO frequency. The apparatus also includes means for determining a VCO frequency for generating each LO frequency. The apparatus also includes means for assigning each determined VCO frequency to each of a plurality of VCO modules based on a distance between the VCO modules and each of the determined VCO frequencies.

In an aspect, of a wireless apparatus for configuring a plurality of VCOs are provided. For example, the apparatus includes a set of VCO modules including at least three VCO modules and a memory. The apparatus also includes at least one processor coupled to the memory. The processor is configured to receive a configuration for a plurality of carriers. Each carrier corresponds to a different LO frequency. The processor is also configured to determine a VCO frequency for generating each LO frequency. The processor is also configured to assign each determined VCO frequency to each of a plurality of VCO modules based on a distance between the VCO modules and each of the determined VCO frequencies.

It is understood that other aspects of apparatus, circuits, and methods will become readily apparent to those skilled in the art from the following detailed description, wherein various aspects of apparatus, circuits, and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

It should be apparent that, in this manner, various exemplary embodiments enable an improved wireless device. Particularly, by assigning operating frequencies to specific VCOs in a pre-configured physical arrangement, multiple VCOs can operate at similar frequencies while mitigating the effects of VCO pulling.

BRIEF DESCRIPTION OF THE DRAWINGS

In order to better understand various exemplary embodiments, reference is made to the accompanying drawings wherein.

DETAILED DESCRIPTION

Figure 1A:
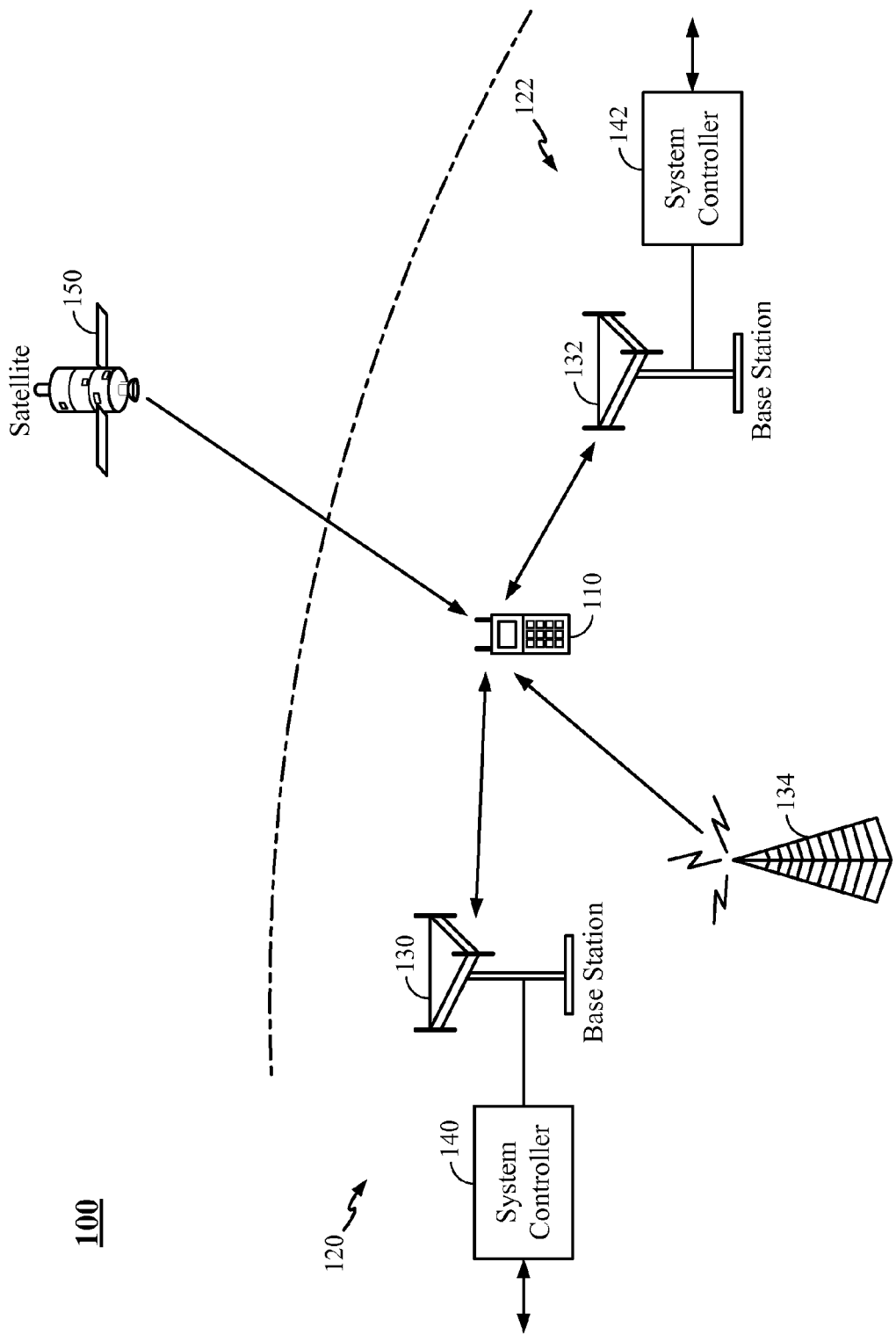
FIG. 1A illustrates a wireless device communicating with different wireless communications systems.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, circuit or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the terms "comprises", "comprising,", "includes" and/or "including", when used herein, specify the presence of the stated features, integers, steps, operations, elements, and/or components, but do not preclude the presence or addition of one or more other features, integers, steps, operations, elements, components, and/or groups thereof.

Various aspects of circuits for minimizing VCO pulling in a multi-frequency receiver will now be presented. However, as those skilled in the art will readily appreciate, such aspects may be extended to other circuit configurations and devices. Accordingly, all references to a specific application for multi-VCO arrangements, or any component, structure, feature, functionality, or process within a synchronized wireless device are intended only to illustrate exemplary aspects of a wireless device with the understanding that such aspects may have a wide differential of applications.

Various embodiments of a multi-frequency wireless device may be used, such as a mobile phone, personal digital assistant (PDA), desktop computer, laptop computer, palm-sized computer, tablet computer, set-top box, navigation device, work station, game console, media player, or any other suitable device.

FIG. 1A illustrates a wireless device communicating with different wireless communications systems. FIG. 1A is a diagram 100 illustrating a wireless device 110 communicating with different wireless communication systems 120, 122. The wireless communication systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1X or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless communication system 120 may be a GSM system, and the wireless communication system 122 may be a WCDMA system. As another example, the wireless communication system 120 may be an LTE system, and the wireless communication system 122 may be a CDMA system.

For simplicity, the diagram 100 shows the wireless communication system 120 including one base station 130 and one system controller 140, and the wireless communication system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless communication system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink may share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 1B:
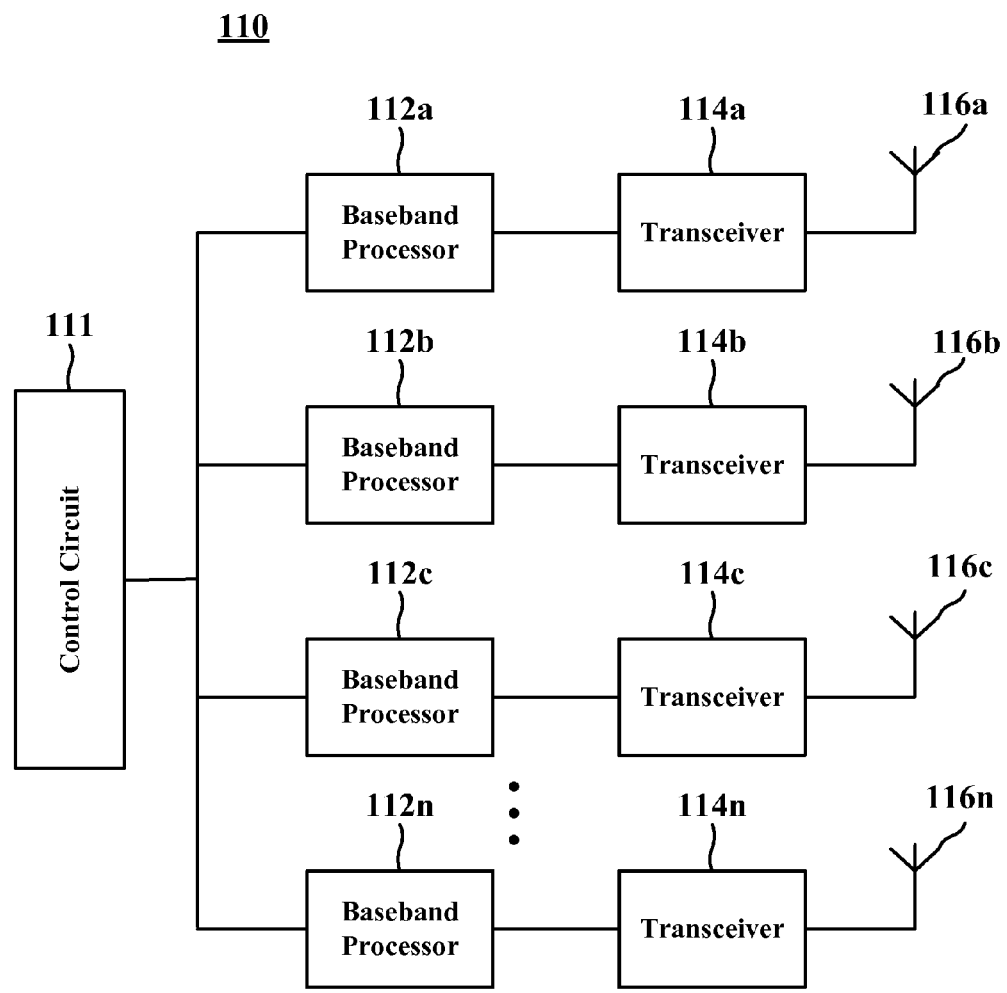
FIG. 1B illustrates an exemplary wireless device with multiple antennas.

FIG. 1B illustrates an exemplary wireless device with multiple antennas. The wireless device 110 includes a control circuit 111, baseband processors 112a-n, wireless transceivers 114a-n, and antennas 116a-n. Control circuit 111 can coordinate with the plurality of baseband processors 112a-n to coordinate and enable communications for wireless device 110 while using multiple antennas.

Control circuit 111 can control each of N (where N≥2) transceiver paths (e.g., baseband processor 112, wireless transceiver 114, and antenna 116) and their respective components included in wireless device 110. For example, in the illustrative embodiment, control circuit 111 controls each of the four transceiver paths ending with antennas 116a-n. In other embodiments, control circuit 111 can be connected to more or less transceivers 114a-n, or more or less transmitter/receiver (TX/RX) paths. In some embodiments, control circuit 111 can coordinate use of one or more TX/RX paths by sending control signals to each baseband processor 112a-n. In some embodiments, an antenna path can include only one path, such as a single receiver path. In such instances, wireless device 110 can, for example, include a single TX path and multiple RX paths. This enables wireless device 110 to transmit at one frequency band, while receiving in multiple frequency bands simultaneously.

Baseband processors 112a-n provide the basic protocol stack required to support wireless communications for each transceiver 114a-n, including, for example, a physical layer for transmitting and receiving data in accordance with the physical and electrical interface to the wireless channel, a data link layer for managing access to the wireless channel, a network layer for managing source to destination data transfer, a transport layer for managing transparent transfer of data between end users, and any other layers necessary or desirable for establishing or supporting a connection to a network through the wireless channel.

Each wireless transceiver 114a-n performs transmitting functions by modulating one or more carrier signals with a data generated by corresponding baseband processor 112a-n for transmission over a wireless channel through corresponding antenna 116a-n. Each wireless transceiver 114a-n performs receiving functions by demodulating one or more carrier signals received from the wireless channel through corresponding antenna 116a-n to recover data for further processing by corresponding baseband processor 112a-n.

Antennas 116a-n can send or receive signals over a wireless channel. The use of one of antennas 116a-n depends on the active TX/RX path. For example, when a path for transceiver 114b is active, the antenna can transmit a modulated signal or receive a modulated signal. In some embodiments, multiple antennas 116a-n can be active simultaneously and can communicate over the wireless channel simultaneously. For example, antennas 116a, b can be active to receive transmissions in parallel when wireless device 110 is in communication through the wireless channel using carrier aggregation.

Figure 2:
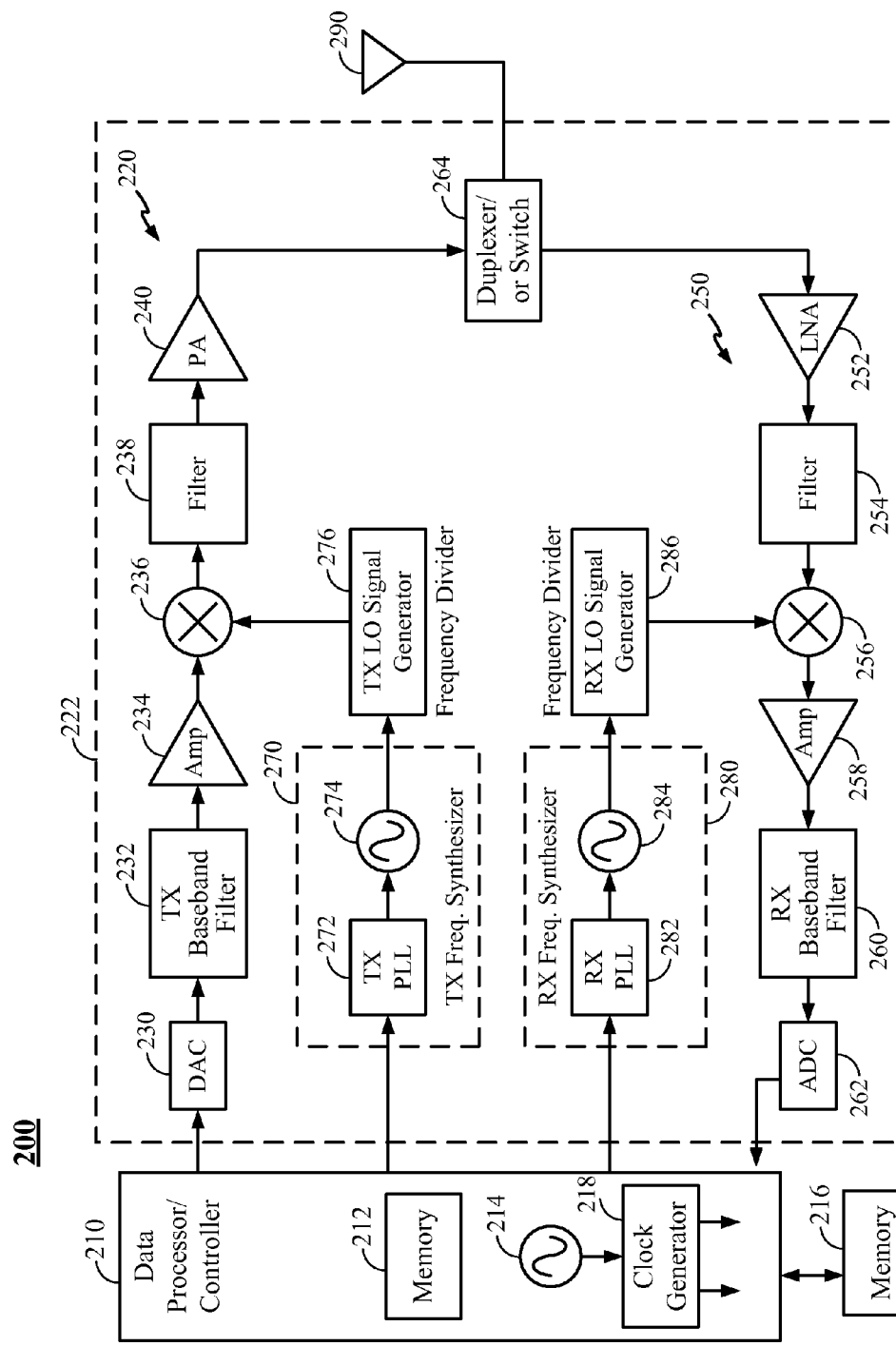
FIG. 2 illustrates an exemplary wireless transceiver employing oscillators for target frequencies.

FIG. 2 is a block diagram 200 of an exemplary wireless device, such as the wireless device 110. The wireless device includes a data processor/controller 210, a transceiver 222, and an antenna 290. In an aspect, wireless device 110 can include multiple transceivers 222. The multiple transceivers 222 can be on the same chip or on multiple, separate chips. The data processor/controller 210 may be referred to as a processing system. A processing system may include the data processor/controller 210 or both the data processor/controller 210 and the memory 216. The transceiver 222 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO signal generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 222 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 218 may receive the VCO signal from the oscillator 214 and may generate clock signals for various modules within the data processor/controller 210. The data processor/controller 210 may be implemented on one or more application specific integrated circuits (ASICs) and/or other ICs.

Figure 3:
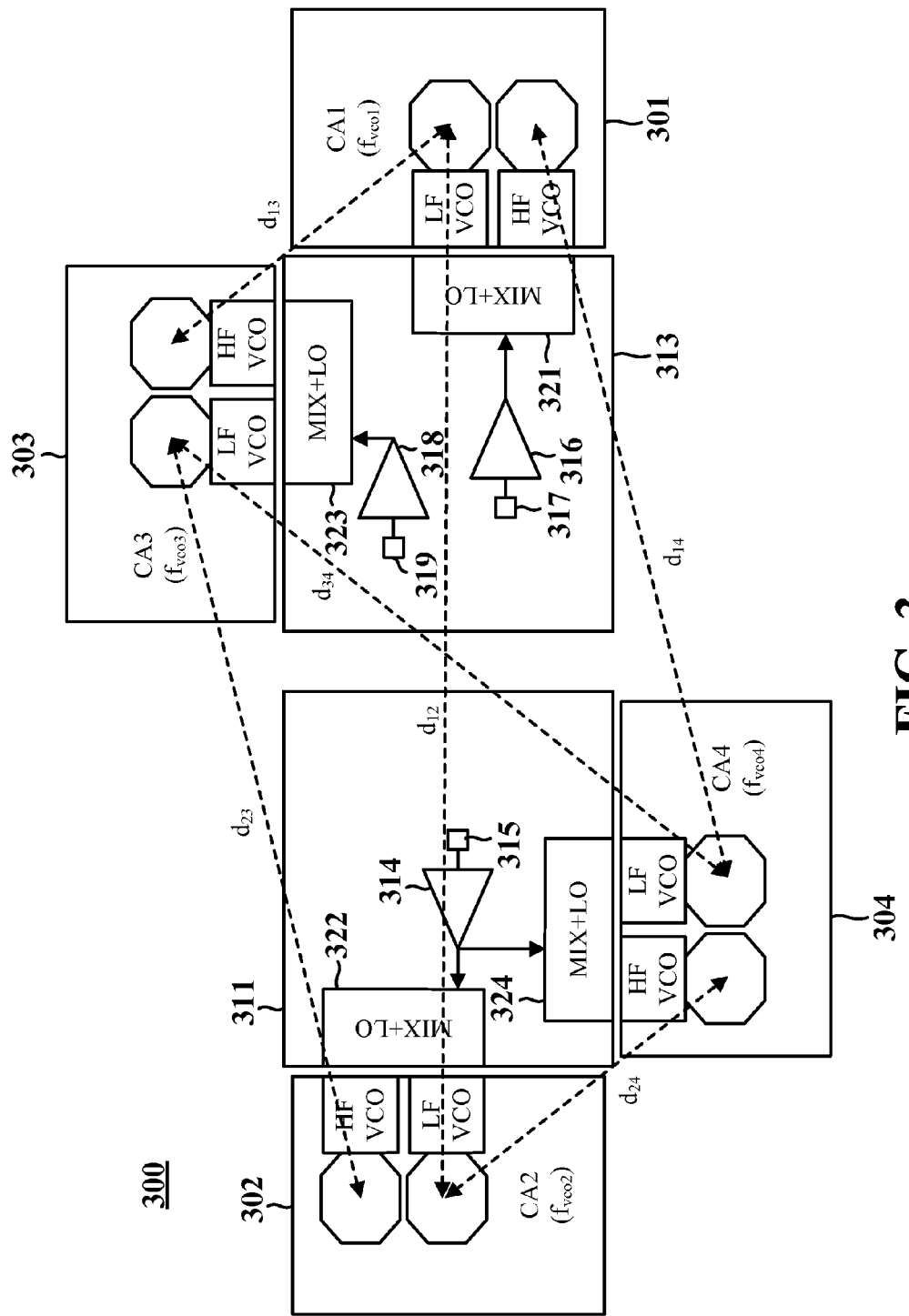
FIG. 3 illustrates exemplary physical arrangement of VCO modules.

FIG. 3 illustrates exemplary physical arrangement of VCO modules. VCO arrangement 300 includes VCO modules 301-304 and transceiver blocks 311, 313. Though VCO arrangement includes four VCO modules, varying quantities of VCOs can be included in other embodiments, such as an asymmetrical arrangement of five VCO modules.

Transceiver block 311 includes amplifier 314, filter 315, and mixer/local oscillator (MIX+LO) blocks 323, 324. Similarly, transceiver block 313 includes amplifier 316, 318, filters 317, 319, and MIX+LO blocks 321, 323. In some embodiments, multiple VCO modules are connected to the same amplifier, as illustrated by transceiver block 311 and VCO modules 302, 304. In other embodiments, each VCO module 301-304 can be connected to an independent amplifier, as illustrated by transceiver block 313 and VCO modules 301, 303. Each MIX+LO block 321-324 can include one or more dividers, such as divide-by-2 (DIV/2), divide-by-4 (DIV/4), or other divider circuit blocks, that modify the frequency sent to the mixer and used in the TX/RX chain. In some embodiments, the divider used can be modified based on the operating frequency of the VCO.

Each VCO module 301-304 can include one or more coils that generate frequencies in specific frequency bands. In the illustrative embodiment for example, VCO module 301 includes a low-band frequency coil ("LF VCO") and a high-band frequency coil ("HF VCO"). In some embodiments, VCO modules 301-304 can include other coils, such as a mid-band frequency coil ("MF VCO"). During operation, VCO modules 301-304 can generate frequencies from each coil; MIX+LO mixer blocks 321-324 only receive one of the coil frequencies at any time. Each VCO module 301-304 in the illustrative embodiment can produce an active frequency of $f_{vcoN}$, where N is 1, 2, 3, or 4.

VCO modules 301-304 are physically arranged on a portion of a circuit chip in wireless device 110 such that each VCO module has known physical distances from all other VCO modules. The known physical distance can be measured from the two closest coils in the respective VCO modules. For example, the distance $d_{13}$ between VCO modules 301 and 303 is the measurement between the LF VCO of VCO module 301 and the HF VCO of VCO module 303. These known physical distances can be stored, for example, in memory 212, 216 and can be used by data processor/controller 210 when generating a frequency plan and/or lookup table for assignment of VCO frequencies.

In the illustrative embodiment for example, distance $d_{12}$ is the largest distance between VCOs and can be over 3 mm. In the illustrative embodiment, VCO modules 301-304 are arranged symmetrically; some distances between VCO modules, such as distances $d_{24}$ and $d_{13}$ or distances $d_{23}$ and $d_{14}$, are equal. In other embodiments, VCO arrangement 300 does not have VCO modules 301-304 arranged symmetrically; in such instances, each distance can be different. The distances between VCO modules 301-304 can be pre-configured and known before frequencies are assigned to a specific VCO module. At the greatest distances, such as $d_{12}$, VCO modules like VCO modules 301 and 302 can operate at identical or very similar frequencies, with the effects of VCO pulling being mitigated by the distance and isolation between the modules.

Figure 4:
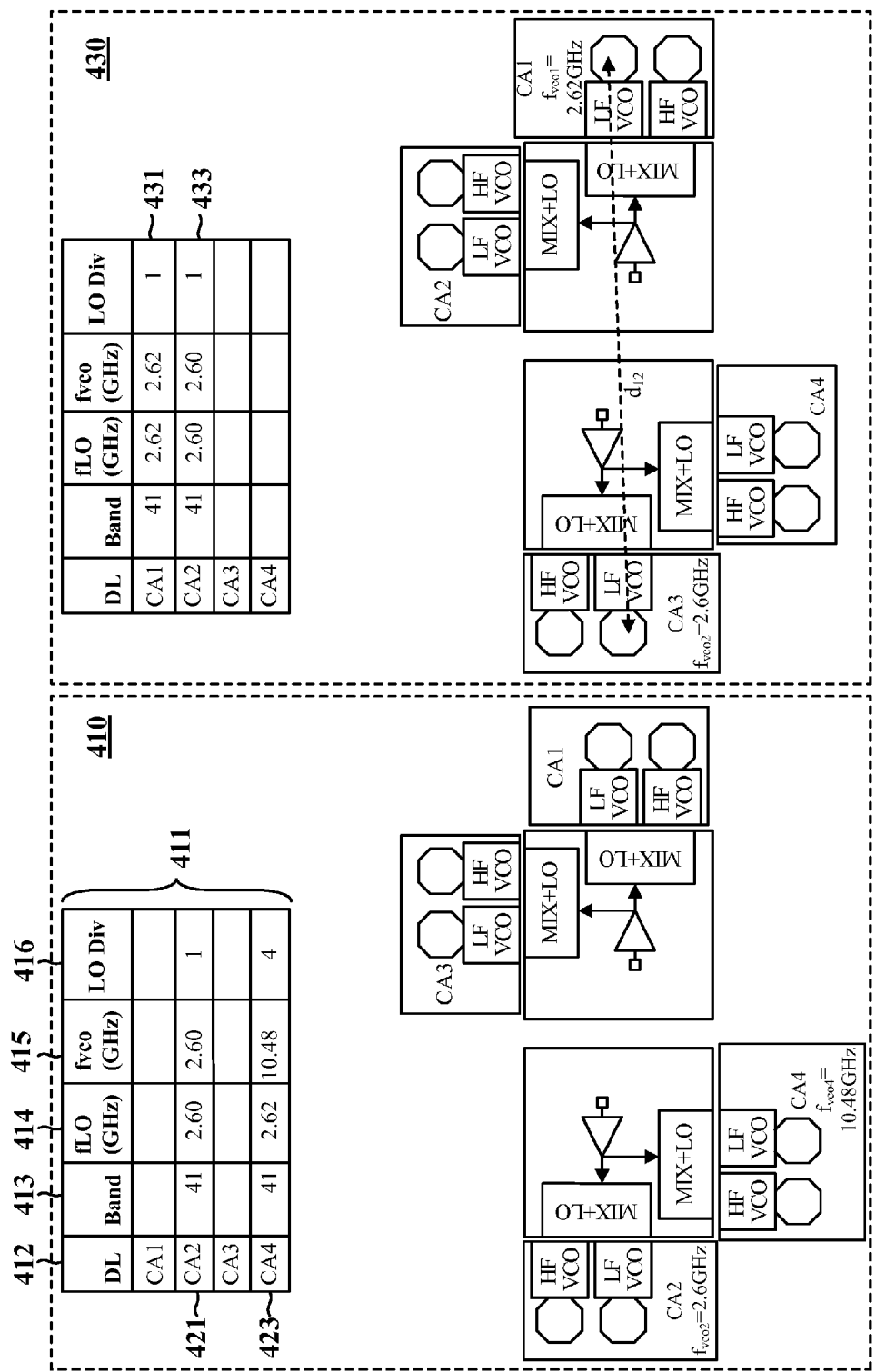
FIG. 4 illustrates an exemplary assignment of carrier frequencies for a VCO module arrangement.

FIG. 4 illustrates an exemplary assignment of carrier frequencies for a VCO module arrangement. VCO arrangement 410 includes an arrangement of VCO frequencies based on a frequency plan. VCO arrangement 430 includes an arrangement of VCO frequencies based on the physical arrangement of the VCO modules and target LO frequencies.

Table 411 includes values for downlink VCO assignment 412, frequency band 413, LO frequency 414, VCO frequency 415, and LO Divider quantity 416. As can be seen by entries 421, 423, VCO arrangement 410 assigns VCO modules 302 and 304 to generate the target LO frequencies of 2.60 and 2.62 GHz, respectively. However, due to the short distance between the respective coils of VCO modules 302 and 304, VCO module 304 generates a 10.48 GHz frequency that is sent through a divider (DIV/4) to generate the target LO frequency.

VCO arrangement 430 assigns VCO modules 301 and 302 (entries 431 and 433, respectively) to produce the same target LO frequencies as those in VCO arrangement 410. Wireless device 110 can use a generated frequency plan and/or a lookup table (LUT) to determine the frequency assignments for VCO modules 301-304. In contrast to VCO arrangement 410, VCO module 301 of VCO arrangement 430 generates a frequency of 2.62 GHz instead of a higher frequency, as the large distance between the coils of VCO modules 301 and 302 allows each module to produce similar frequencies while the effects of VCO coupling and VCO pulling is mitigated. Even though the target LO frequencies are close, the phase noise degradation and current consumption are reduced.

Figure 5:
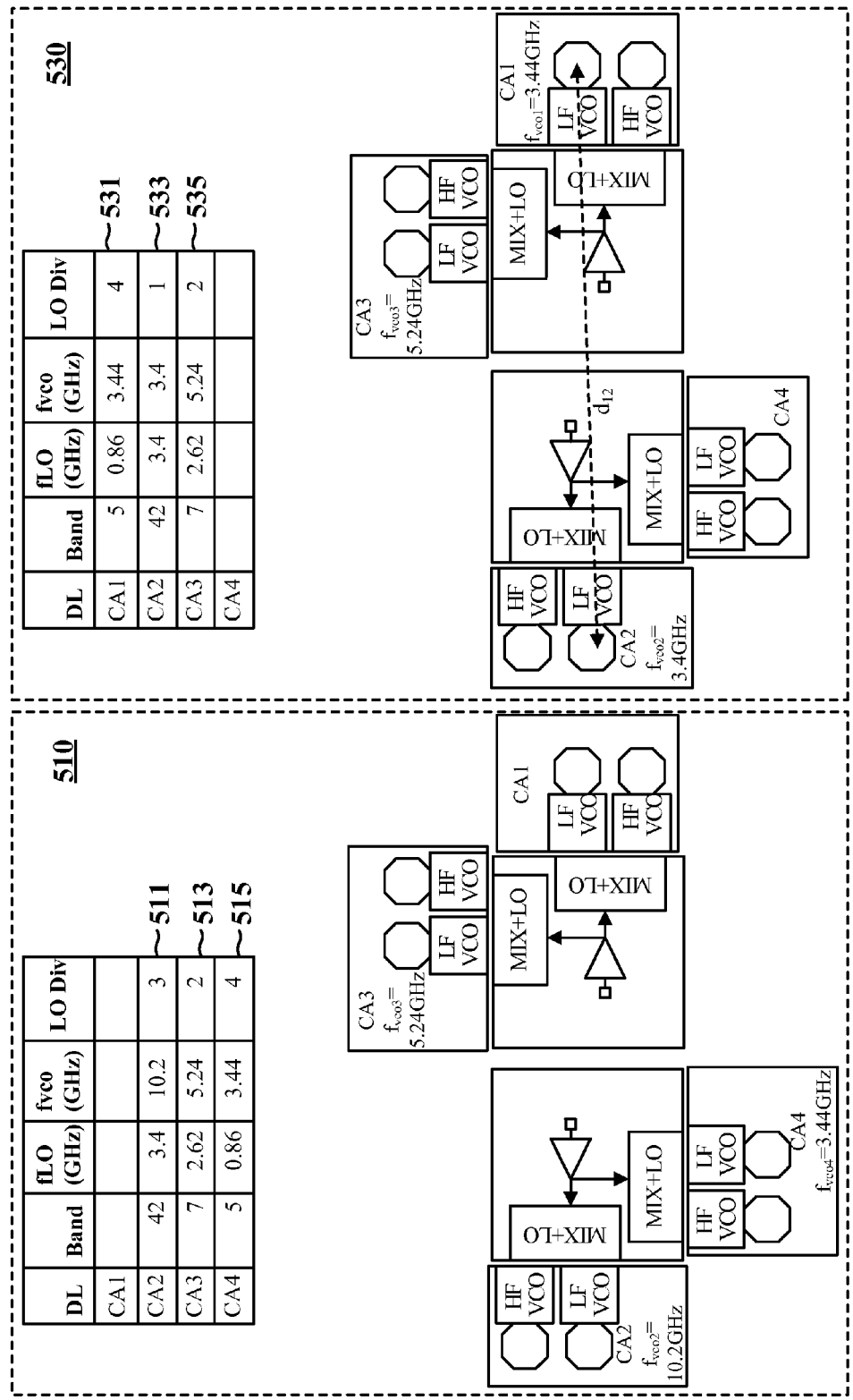
FIG. 5 illustrates another exemplary assignment of carrier frequencies for a VCO module arrangement.

FIG. 5 illustrates another exemplary assignment of carrier frequencies for a VCO module arrangement. Similar to FIG. 4, VCO arrangement 510 is based on use of a frequency plan that does not account for physical distances between VCO modules 301-304, while arrangement 530 is based on assigning VCO frequencies using a frequency plan that also accounts for physical distances between VCO modules 301-304. For arrangement 510, VCO modules 302-304 generate frequencies. In order to avoid phase noise frequencies and potential VCO pulling between any of the modules, each VCO does not generate a frequency close to the other frequencies being generated. To produce the target LO frequencies, each VCO module 302-304 uses a divider of 2 or larger based on the VCO frequencies prescribed by the frequency plan and/or LUT.

VCO arrangement 530 uses a frequency plan that accounts for physical distances $d_{12}$ $d_{13}$, $d_{23}$, etc., where wireless device 110 shifts the three VCO modules used to VCO modules 301-303. As seen by entries 531 and 533, VCO modules 301 and 302 produce similar frequencies, while VCO module 301 produces the target LO frequency that was produced by VCO module 304 in VCO arrangement 510. Under the new arrangement, VCO module 302, while producing the same target LO frequency, does so by generating 3.4 GHz using no divider, as opposed to 10.2 GHz generated frequency in VCO arrangement 510. Because the 3.44 GHz frequency is generated by VCO module 301 in VCO arrangement 510, a maximum distance away from VCO module 302, VCO module 302 is able to produce a lower operating frequency with the effects of VCO coupling and the resultant VCO pulling being mitigated.

Figure 6:
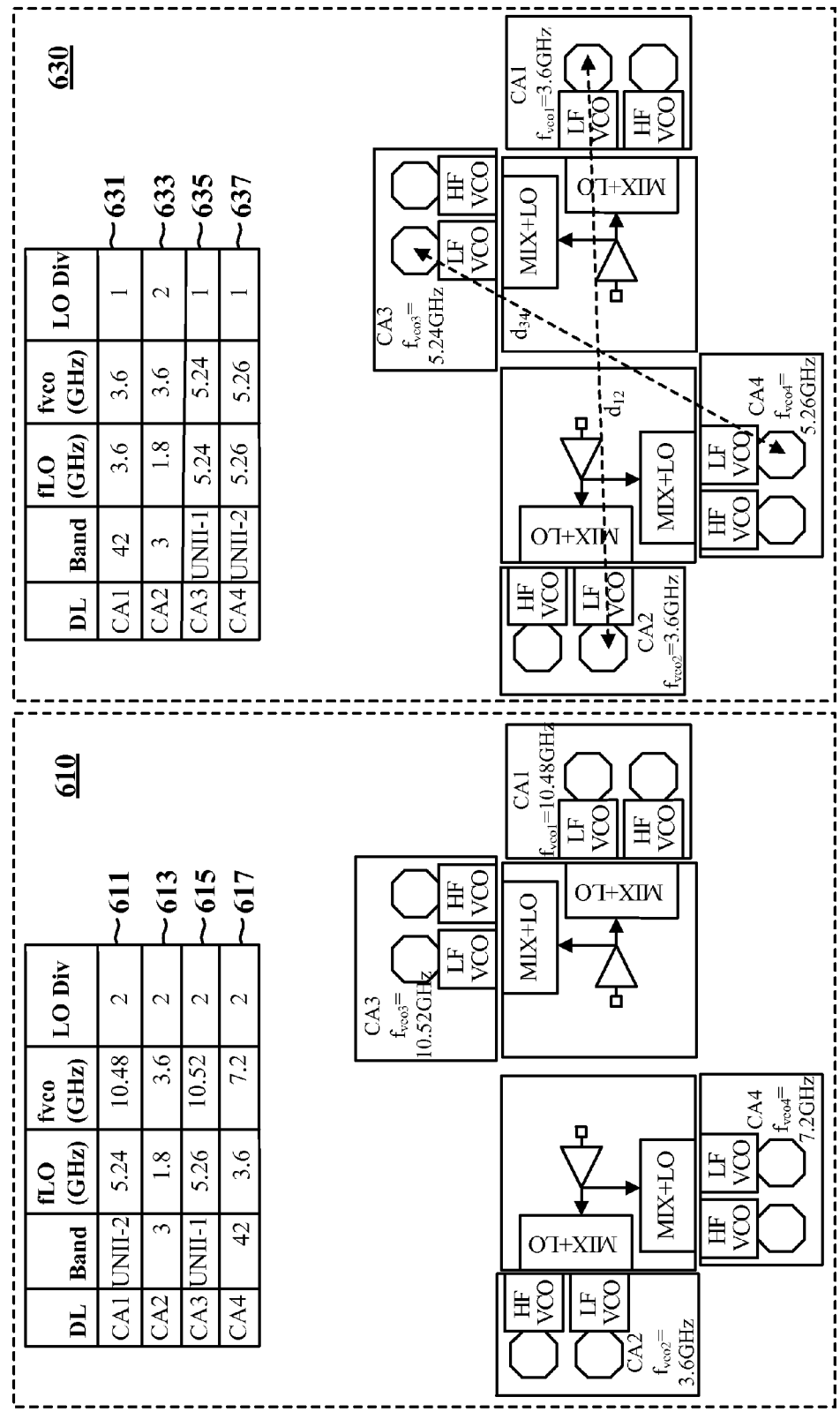
FIG. 6 illustrates another exemplary assignment of carrier frequencies for a VCO module arrangement.

FIG. 6 illustrates another exemplary assignment of carrier frequencies for a VCO module arrangement. Similar to FIGS. 4 and 5, VCO arrangement 610 is based on using a frequency plan not accounting for physical distances between VCO modules 301-304, while arrangement 630 is based on a frequency plan that assigns frequencies to VCO modules 301-304 while accounting for distance. As seen in entries 611-617, all four VCO modules 301-304 are used simultaneously, which results in some of the VCO modules generating similar frequencies.

VCO arrangement 630, using a frequency plan that accounts for physical distances between VCO modules 301-304, generates two pairs of similar frequencies. As seen by entries 631-637 in the lookup table, VCO modules 301 and 302 generate the same frequency even though the target LO frequencies differ between them; the distance between VCO modules 301 and 302 enables the two modules to operate at the same frequency without appreciable VCO pulling. VCO module 303 no longer uses a divider to generate a 5.24 GHz frequency. Further, VCO module 304 now generates a lowered frequency of 5.26 GHz without the need for a divider.

Figure 7:
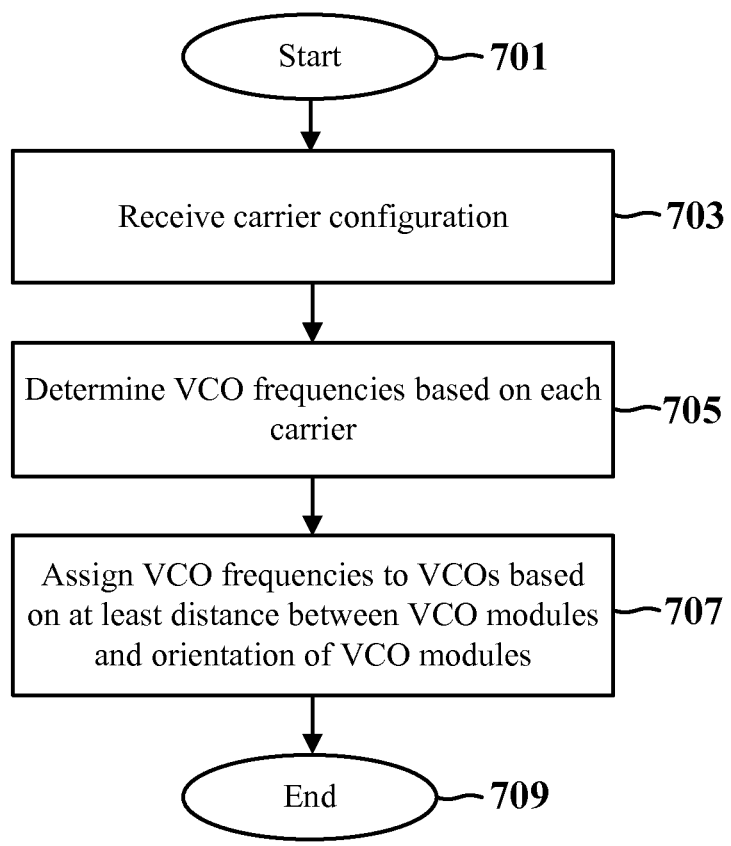
FIG. 7 illustrates an exemplary method for providing multiple carrier frequencies from a VCO module arrangement.

FIG. 7 illustrates an exemplary method for providing multiple carrier frequencies from a VCO module arrangement. Wireless device/UE 110 can use control circuit 111 or processor/controller 210 perform method 700, for example, when configuring one or more TX/RX chains before setting up a connection over one or more frequency bands. In some embodiments, wireless device 110 can perform method 700 to rearrange the assignments of VCO modules in VCO arrangement 300.

Method 700 starts at step 701 and proceeds to step 703, where wireless device 110 receives the carrier configuration. In some embodiments, control circuit 111 or processor/controller 210 can receive a carrier configuration including a plurality of target LO frequencies to be used in each of the respective active TX/RX chains. For example, referring to FIG. 5, control circuit 111 can receive a carrier configuration of 860 MHz, 2.62 GHz, and 3.4 GHz for the preparation of VCO arrangement 530. In an aspect, wireless device 110 or processor/controller 210 in step 703 can also determine the physical distances between VCO modules 301-310. In an aspect, the determined physical distances between VCO modules (e.g., $d_{12}$, $d_{13}$, $d_{23}$, etc.) can, in step 703, be retrieved from memory 212, 216 by processor/controller 210.

Upon receiving the carrier information in step 703, wireless device 110 can proceed to step 705, where wireless device 110 determines VCO frequencies based on each carrier. In an aspect, control circuit 111 can use the received carrier configuration to determine a VCO frequency and divider combination to generate each target LO frequency. In some embodiments, the maximum and minimum thresholds for VCO operating frequencies may differ from the target LO frequencies. In such instances, dividers can be added between the output of the VCO and the input of the mixer to produce the target LO frequency. For example, control circuit 111 when preparing VCO arrangement 530 can determine a VCO operating frequency of 3.44 GHz when the target LO frequency is 860 MHz. The 860 MHz target LO frequency may be below the minimum operating threshold of any VCO module. In such instances, control circuit can determine a combination of a VCO frequency (e.g., 3.44 GHz) and frequency divider value (e.g., 4) to produce the target LO frequency.

In some embodiments, the number of VCO frequencies determined by wireless device 110 is based on the number of available VCO modules. In an aspect, control circuit 111 can generate a frequency plan based on a combination of the carrier configuration and the physical distances between VCO modules 301-304. For example, control circuit 111 can determine four VCO frequencies when it receives a four-frequency carrier configuration and four VCO modules are available in VCO arrangement 300. If all four VCO modules are available, control circuit 111 can determine four VCO frequencies for assignment to each of the available VCO modules. For example, control circuit 111 can determine four VCO frequencies for four available VCO modules when preparing VCO arrangement 630. In other embodiments, control circuit 111 can determine smaller number of frequencies and assign them among the available VCO modules. For example, when configuring for arrangement 530, control circuit 111 can assign the three frequencies of the frequency plan among the four available VCO modules 301-304.

In step 707, wireless device can assign each of the determined VCO frequencies to VCO modules in the VCO arrangement based on factors, such as physical distance between VCO modules. In some embodiments, the control circuit 111 can use a frequency plan and assign the determined VCO frequencies based on physical distances between VCO modules 301-304, with the closest frequencies being assigned to the VCO modules that are arranged with the largest physical distance between them. In some embodiments, control circuit 111 can generate or modify a frequency plan by determining a difference between the two or more VCO frequencies and comparing the difference to a threshold. When the difference is below the threshold, control circuit can ensure that the two VCO frequencies that made that difference are assigned to VCO modules with a maximum distance apart. For example, in VCO arrangement 630, the VCO frequency difference between $f_{vco1}$ and $f_{vco2}$ is zero. Control circuit 111 can compare the difference of 0 MHz to a threshold of 50 MHz and determine to assign the VCO frequencies to VCO modules 301 and 302, respectively. The threshold value can be modified based on the allowable phase noise and current consumption for a specific carrier configuration.

In some embodiments, control circuit 111 can determine multiple frequency differences between the determined VCO frequencies and can assign VCO frequencies to VCO modules such that the VCO frequencies that produce the smallest frequency difference are generated using VCO modules with the greatest physical distance between them, with smaller frequency differences taking less precedence. For example, for VCO arrangement 630, control circuit 111 can assign the 3.6 GHz VCO frequencies with the highest precedence, assigning them to VCO modules 301 and 302 respectively so that the maximum distance of $d_{12}$ is between the two VCO frequencies. Control circuit 111 can then assign the 5.24 GHz and 5.26 GHz VCO frequencies with lower precedence to VCO modules 303 and 304. Once the VCO frequencies are assigned in step 707, method 700 may end at step 709.

In one configuration, the set of VCO modules includes a first VCO module, a second VCO module, a third VCO module, and a fourth VCO module. The first VCO module is located a distance $d_{12}$ from the second VCO module, the first VCO module is located a distance $d_{13}$ from the third VCO module, the first VCO module is located a distance $d_{14}$ from the fourth VCO module, the second VCO module is located a distance $d_{23}$ from the third VCO module, the second VCO module is located a distance $d_{24}$ from the fourth VCO module, and the third VCO module is located a distance $d_{34}$ from the fourth VCO module. In such a configuration, the distance $d_{12}$ is greater than the distances $d_{13}$, $d_{14}$, $d_{23}$, $d_{24}$, and $d_{34}$; the distance $d_{23}$ is greater than the distance $d_{24}$; and the distance $d_{14}$ is greater than the distance $d_{13}$.

In one configuration, in step 705, the UE may determine the VCO frequency for generating each LO frequency by determining two VCO frequencies, including a first VCO frequency and a second VCO frequency. In addition, in step 707, the UE may assign the determined VCO frequencies by assigning, when a difference between the first VCO frequency and the second VCO frequency is less than a threshold, one of the first VCO frequency or the second VCO frequency to the first VCO module and the other one of the first VCO frequency or the second VCO frequency to the second VCO module.

In one configuration, in step 705, the UE may determine the VCO frequency for generating each LO frequency by determining three VCO frequencies, including a first VCO frequency, a second VCO frequency, and a third VCO frequency. In addition, in step 707, the UE may assign the determined VCO frequencies by assigning two VCO frequencies of the first, second, and third VCO frequencies with the least difference between the two VCO frequencies to the first and second VCO modules, and by assigning a remaining VCO frequency of the first, second, and third VCO frequencies to one of the third VCO module or the fourth VCO module.

In one configuration, in step 705, the UE may determine the VCO frequency for generating each LO frequency by determining four VCO frequencies, including a first VCO frequency, a second VCO frequency, a third VCO frequency, and a fourth VCO frequency. In addition, in step 707, the UE may assign the determined VCO frequencies by assigning two VCO frequencies of the first, second, third, and fourth VCO frequencies with the least difference between the two VCO frequencies to the first and second VCO modules, and by assigning two remaining VCO frequencies of the first, second, third, and fourth VCO frequencies to the third VCO module and the fourth VCO module.

Therefore, the aspects disclosed herein achieve lower VCO coupling and lower VCO pulling. Such mitigation in VCO pulling reduces phase noise and in-band spurs, while also reducing current consumption associated with other VCO pulling mitigation techniques.

It is understood that the specific order or hierarchy of steps in the processes/flow charts disclosed is an illustration of exemplary approaches. Based upon design preferences, it is understood that the specific order or hierarchy of steps in the processes/flow charts may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of configuring a plurality of voltage controlled oscillators (VCOs), comprising:
    receiving a configuration for a plurality of carriers, each carrier corresponding to a different local oscillator (LO) frequency;
    determining a VCO frequency for generating each LO frequency; and
    assigning each determined VCO frequency to each of a plurality of VCO modules based on a distance between the VCO modules and each of the determined VCO frequencies, the plurality of VCO modules being of a set of VCO modules including at least three VCO modules.

2. The method of claim 1, wherein:
    the set of VCO modules comprises a first VCO module, a second VCO module, a third VCO module, and a fourth VCO module;
    the first VCO module is located a distance $d_{12}$ from the second VCO module, the first VCO module is located a distance $d_{13}$ from the third VCO module, the first VCO module is located a distance $d_{14}$ from the fourth VCO module, the second VCO module is located a distance $d_{23}$ from the third VCO module, the second VCO module is located a distance $d_{24}$ from the fourth VCO module, and the third VCO module is located a distance $d_{34}$ from the fourth VCO module;
    the distance $d_{12}$ is greater than the distances $d_{13}$, $d_{14}$, $d_{23}$, $d_{24}$, and $d_{34}$;
    the distance $d_{23}$ is greater than the distance $d_{24}$; and
    the distance $d_{14}$ is greater than the distance $d_{13}$.

3. The method of claim 2, wherein:
    the determining the VCO frequency for generating each LO frequency comprises determining two VCO frequencies, including a first VCO frequency and a second VCO frequency; and
    the assigning comprises assigning, when a difference between the first VCO frequency and the second VCO frequency is less than a threshold, one of the first VCO frequency or the second VCO frequency to the first VCO module and an other one of the first VCO frequency or the second VCO frequency to the second VCO module.

4. The method of claim 2, wherein:
the determining the VCO frequency for generating each LO frequency comprises determining three VCO frequencies, including a first VCO frequency, a second VCO frequency, and a third VCO frequency;
the assigning comprises assigning two VCO frequencies of the first, second, and third VCO frequencies with the least difference between the two VCO frequencies to the first and second VCO modules, and assigning a remaining VCO frequency of the first, second, and third VCO frequencies to one of the third VCO module or the fourth VCO module.

5. The method of claim 2, wherein:
the determining the VCO frequency for generating each LO frequency comprises determining four VCO frequencies, including a first VCO frequency, a second VCO frequency, a third VCO frequency, and a fourth VCO frequency; and
the assigning comprises assigning two VCO frequencies of the first, second, third, and fourth VCO frequencies with the least difference between the two VCO frequencies to the first and second VCO modules, and assigning two remaining VCO frequencies of the first, second, third, and fourth VCO frequencies to the third VCO module and the fourth VCO module.

6. An apparatus for configuring a plurality of voltage controlled oscillators (VCOs), comprising:
a set of VCO modules including at least three VCO modules;
means for receiving a configuration for a plurality of carriers, each carrier corresponding to a different local oscillator (LO) frequency;
means for determining a VCO frequency for generating each LO frequency; and
means for assigning each determined VCO frequency to each of a plurality of VCO modules based on a distance between the VCO modules and each of the determined VCO frequencies, the plurality of VCO modules being of the set of VCO modules.

7. The apparatus of claim 6, wherein:
the set of VCO modules comprises a first VCO module, a second VCO module, a third VCO module, and a fourth VCO module;
the first VCO module is located a distance $d_{12}$ from the second VCO module, the first VCO module is located a distance $d_{13}$ from the third VCO module, the first VCO module is located a distance $d_{14}$ from the fourth VCO module, the second VCO module is located a distance $d_{23}$ from the third VCO module, the second VCO module is located a distance $d_{24}$ from the fourth VCO module, and the third VCO module is located a distance $d_{34}$ from the fourth VCO module;
the distance $d_{12}$ is greater than the distances $d_{13}$, $d_{14}$, $d_{23}$, $d_{24}$, and $d_{34}$;
the distance $d_{23}$ is greater than the distance $d_{24}$; and
the distance $d_{14}$ is greater than the distance $d_{13}$.

8. The apparatus of claim 7, wherein:
the means for determining the VCO frequency for generating each LO frequency is configured to determine two VCO frequencies, including a first VCO frequency and a second VCO frequency; and
the means for assigning is configured to assign, when a difference between the first VCO frequency and the second VCO frequency is less than a threshold, one of the first VCO frequency or the second VCO frequency to the first VCO module and an other one of the first VCO frequency or the second VCO frequency to the second VCO module.

9. The apparatus of claim 7, wherein:
the means for determining the VCO frequency for generating each LO frequency is configured to determine three VCO frequencies, including a first VCO frequency, a second VCO frequency, and a third VCO frequency;
the means for assigning is configured to assign two VCO frequencies of the first, second, and third VCO frequencies with the least difference between the two VCO frequencies to the first and second VCO modules, and to assign a remaining VCO frequency of the first, second, and third VCO frequencies to one of the third VCO module or the fourth VCO module.

10. The apparatus of claim 7, wherein:
the means for determining the VCO frequency for generating each LO frequency is configured to determine four VCO frequencies, including a first VCO frequency, a second VCO frequency, a third VCO frequency, and a fourth VCO frequency; and
the means for assigning is configured to assign two VCO frequencies of the first, second, third, and fourth VCO frequencies with the least difference between the two VCO frequencies to the first and second VCO modules, and to assign two remaining VCO frequencies of the first, second, third, and fourth VCO frequencies to the third VCO module and the fourth VCO module.

11. An apparatus for configuring a plurality of voltage controlled oscillators (VCOs), comprising:
a set of VCO modules including least three VCO modules;
a memory; and
at least one processor coupled to the memory and configured to:
receive a configuration for a plurality of carriers, each carrier corresponding to a different local oscillator (LO) frequency;
determine a VCO frequency for generating each LO frequency; and
assign each determined VCO frequency to each of a plurality of VCO modules based on a distance between VCO modules and each of the determined VCO frequencies, the plurality of VCO modules being of the set of VCO modules.

12. The apparatus of claim 11, wherein:
the set of VCO modules comprises a first VCO module, a second VCO module, a third VCO module, and a fourth VCO module;
the first VCO module is located a distance $d_{12}$ from the second VCO module, the first VCO module is located a distance $d_{13}$ from the third VCO module, the first VCO module is located a distance $d_{14}$ from the fourth VCO module, the second VCO module is located a distance $d_{23}$ from the third VCO module, the second VCO module is located a distance $d_{24}$ from the fourth VCO module, and the third VCO module is located a distance $d_{34}$ from the fourth VCO module;
the distance $d_{12}$ is greater than the distances $d_{13}$, $d_{14}$, $d_{23}$, $d_{24}$, and $d_{34}$;
the distance $d_{23}$ is greater than the distance $d_{24}$; and
the distance $d_{14}$ is greater than the distance $d_{13}$.

13. The apparatus of claim 12, wherein the at least one processor is further configured to:
determine the VCO frequency for generating each LO frequency by determining two VCO frequencies, including a first VCO frequency and a second VCO frequency; and assign each determined VCO frequency by assigning, when a difference between the first VCO frequency and the second VCO frequency is less than a threshold, one of the first VCO frequency or the second VCO frequency to the first VCO module and an other one of the first VCO frequency or the second VCO frequency to the second VCO module.

14. The apparatus of claim 12, wherein the at least one processor is further configured to:
determine the VCO frequency for generating each LO frequency by determining three VCO frequencies, including a first VCO frequency, a second VCO frequency, and a third VCO frequency;
assign each determined VCO frequency by assigning two VCO frequencies of the first, second, and third VCO frequencies with the least difference between the two VCO frequencies to the first and second VCO modules, and assigning a remaining VCO frequency of the first, second, and third VCO frequencies to one of the third VCO module or the fourth VCO module.

15. The apparatus of claim 14, wherein the processor is further configured to:
determine the VCO frequency for generating each LO frequency by determining four VCO frequencies, including a first VCO frequency, a second VCO frequency, a third VCO frequency, and a fourth VCO frequency; and
assign each determined VCO frequency by assigning two VCO frequencies of the first, second, third, and fourth VCO frequencies with the least difference between the two VCO frequencies to the first and second VCO modules, and assigning two remaining VCO frequencies of the first, second, third, and fourth VCO frequencies to the third VCO module and the fourth VCO module.

16. A non-transitory computer-readable medium storing computer-executable code for configuring a plurality of voltage controlled oscillators (VCOs), comprising:
code for receiving a configuration for a plurality of carriers, each carrier corresponding to a different local oscillator (LO) frequency;
code for determining a VCO frequency for generating each LO frequency; and
code for assigning each determined VCO frequency to each of a plurality of VCO modules based on a distance between the VCO modules and each of the determined VCO frequencies, the plurality of VCO modules being of a set of VCO modules including at least three VCO modules.

17. The non-transitory computer-readable medium of claim 16, wherein:
the set of VCO modules comprises a first VCO module, a second VCO module, a third VCO module, and a fourth VCO module;
the first VCO module is located a distance $d_{12}$ from the second VCO module, the first VCO module is located a distance $d_{13}$ from the third VCO module, the first VCO module is located a distance $d_{14}$ from the fourth VCO module, the second VCO module is located a distance $d_{23}$ from the third VCO module, the second VCO module is located a distance $d_{24}$ from the fourth VCO module, and the third VCO module is located a distance $d_{34}$ from the fourth VCO module;
the distance $d_{12}$ is greater than the distances $d_{13}$, $d_{14}$, $d_{23}$, $d_{23}$, $d_{24}$, and $d_{34}$;
the distance $d_{23}$ is greater than the distance $d_{24}$; and
the distance $d_{14}$ is greater than the distance $d_{13}$.

18. The non-transitory computer-readable medium of claim 17, wherein:
the code for determining the VCO frequency for generating each LO frequency further comprises code for determining two VCO frequencies, including a first VCO frequency and a second VCO frequency; and
the code for assigning further comprises code for assigning, when a difference between the first VCO frequency and the second VCO frequency is less than a threshold, the first VCO module one of the first VCO frequency or the second VCO frequency to the first VCO module and an other one of the first VCO frequency or the second VCO frequency to the second VCO module.

19. The non-transitory computer-readable medium of claim 17, wherein:
the code for determining the VCO frequency for generating each LO frequency further comprises code for determining three VCO frequencies, including a first VCO frequency, a second VCO frequency, and a third VCO frequency;
the code for assigning further comprises code for assigning two VCO frequencies of the first, second, and third VCO frequencies with the least difference between the two VCO frequencies to the first and second VCO modules, and assigning a remaining VCO frequency of the first, second, and third VCO frequencies to one of the third VCO module or the fourth VCO module.

20. The non-transitory computer-readable medium of claim 17, wherein:
the code for determining the VCO frequency for generating each LO frequency further comprises code for determining four VCO frequencies, including a first VCO frequency, a second VCO frequency, a third VCO frequency, and a fourth VCO frequency; and
the code for assigning further comprises code for assigning two VCO frequencies of the first, second, third, and fourth VCO frequencies with the least difference between the two VCO frequencies to the first and second VCO modules, and assigning two remaining VCO frequencies of the first, second, third, and fourth VCO frequencies to the third VCO module and the fourth VCO module.

* * * * *